US012176351B2

(12) United States Patent
Sporer et al.

(10) Patent No.: US 12,176,351 B2
(45) Date of Patent: Dec. 24, 2024

(54) PHOTONICS CHIPS INCLUDING A FULLY-DEPLETED SILICON-ON-INSULATOR FIELD-EFFECT TRANSISTOR

(71) Applicant: GlobalFoundries U.S. Inc., Malta, NY (US)

(72) Inventors: Ryan Sporer, Mechanicville, NY (US); George R. Mulfinger, Wilton, NY (US); Yusheng Bian, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 174 days.

(21) Appl. No.: 17/973,618

(22) Filed: Oct. 26, 2022

(65) Prior Publication Data
US 2023/0047046 A1 Feb. 16, 2023

Related U.S. Application Data

(62) Division of application No. 17/394,770, filed on Aug. 5, 2021, now Pat. No. 11,569,268.

(51) Int. Cl.
*H01L 27/12* (2006.01)
*H01L 21/762* (2006.01)
(Continued)

(52) U.S. Cl.
CPC .... *H01L 27/1203* (2013.01); *H01L 21/76224* (2013.01); *H01L 21/84* (2013.01);
(Continued)

(58) Field of Classification Search
CPC .......... H01L 27/1203; H01L 21/76224; H01L 21/84; H01L 27/14612; H01L 27/14643; H01L 29/0649; H01L 21/76283
See application file for complete search history.

(56) References Cited

U.S. PATENT DOCUMENTS

7,454,102 B2 *  11/2008  Keyser ................ G02B 6/12
                                                     385/39
7,510,904 B2 *  3/2009   Chu ................... H01L 31/101
                                                     257/E21.093
(Continued)

FOREIGN PATENT DOCUMENTS

| CN | 107437507 B | * | 9/2020  | ............. H01L 21/84 |
|----|-------------|---|---------|-------------------------|
| CN | 113725215 A | * | 11/2021 | ............. H01L 21/84 |
| JP | 2007201006 A | * | 8/2007 | ............. H01L 21/84 |

OTHER PUBLICATIONS

Vladimir Stojanović, et al., "Monolithic silicon-photonic platforms in state-of-the-art CMOS SOI processes," Opt. Express 26, 13106-13121 (2018).
(Continued)

*Primary Examiner* — Mohammed Shamsuzzaman
(74) *Attorney, Agent, or Firm* — Thompson Hine LLP; Anthony Canale

(57) ABSTRACT

Structures for a photonics chip that include a fully-depleted silicon-on-insulator field-effect transistor and related methods. A first device region of a substrate includes a first device layer, a first portion of a second device layer, and a buried insulator layer separating the first device layer from the first portion of the second device layer. A second device region of the substrate includes a second portion of the second device layer. The first device layer, which has a thickness in a range of about 4 to about 20 nanometers, transitions in elevation to the second portion of the second device layer with a step height equal to a sum of the thicknesses of the first device layer and the buried insulator layer. A field-effect transistor includes a gate electrode on the top surface of the first device layer. An optical component includes the second portion of the second device layer.

16 Claims, 13 Drawing Sheets

(51) Int. Cl.
  *H01L 21/84* (2006.01)
  *H01L 27/146* (2006.01)
  *H01L 29/06* (2006.01)

(52) U.S. Cl.
  CPC .. *H01L 27/14612* (2013.01); *H01L 27/14643* (2013.01); *H01L 29/0649* (2013.01)

(56) References Cited

U.S. PATENT DOCUMENTS

| | | | | |
|---|---|---|---|---|
| 7,759,714 | B2* | 7/2010 | Itoh | G11C 11/4097 |
| | | | | 257/296 |
| 8,298,875 | B1* | 10/2012 | Or-Bach | H01L 27/0694 |
| | | | | 438/141 |
| 8,652,934 | B1* | 2/2014 | Meade | H01L 27/14689 |
| | | | | 438/424 |
| 8,895,413 | B2* | 11/2014 | Pinguet | H01L 27/1203 |
| | | | | 257/351 |
| 9,356,163 | B1* | 5/2016 | Liu | H01L 27/14643 |
| 10,249,633 | B2* | 4/2019 | Richter | H10B 41/42 |
| 10,355,017 | B1* | 7/2019 | Nakatsuji | H10B 43/50 |
| 10,698,156 | B2* | 6/2020 | Coolbaugh | G02B 6/13 |
| 10,816,724 | B2* | 10/2020 | Coolbaugh | G02B 6/122 |
| RE48,379 | E | 1/2021 | Ho et al. | |
| 11,029,466 | B2* | 6/2021 | Charles | H01S 5/4031 |
| 11,031,394 | B1* | 6/2021 | Or-Bach | H01L 21/823475 |
| 11,081,561 | B2* | 8/2021 | Shank | H01L 29/42376 |
| 11,482,521 | B2* | 10/2022 | Blackwell | H01L 27/0688 |
| 11,803,009 | B2* | 10/2023 | Pandey | G02B 6/122 |
| 2005/0169566 | A1* | 8/2005 | Takahashi | G02F 1/011 |
| | | | | 385/1 |
| 2007/0253663 | A1* | 11/2007 | Keyser | G02B 6/12 |
| | | | | 385/36 |
| 2009/0224321 | A1* | 9/2009 | Tsuchiya | H01L 21/823807 |
| | | | | 438/154 |
| 2013/0137224 | A1* | 5/2013 | Khan | H01L 29/66659 |
| | | | | 438/479 |
| 2016/0300856 | A1* | 10/2016 | Moll | H01L 29/78675 |
| 2017/0323973 | A1 | 11/2017 | Clifton et al. | |
| 2017/0338343 | A1* | 11/2017 | Baudot | H01L 29/7838 |
| 2019/0035815 | A1* | 1/2019 | Smith | H01L 21/84 |
| 2023/0273369 | A1* | 8/2023 | Pandey | H01L 21/84 |
| | | | | 385/14 |

OTHER PUBLICATIONS

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611.

M. Rakowski, et al., "45nm CMOS—Silicon Photonics Monolithic Technology (45CLO) for next-generation, low power and high speed optical interconnects," in Optical Fiber Communication Conference (OFC) 2020, OSA Technical Digest (Optical Society of America, 2020), paper T3H.3.

Y. Bian, et al. "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optical Society of America, 2020), paper FW5D.2.

Y. Bian et al., "Monolithically integrated silicon nitride platform," 2021 Optical Fiber Communications Conference and Exhibition (OFC), 2021, pp. 1-3.

Holt et al., "Silicon-on-insulator Chip Structure with Substrate-Embedded Optical Waveguide and Method" filed Dec. 23, 2020 as U.S. Appl. No. 17/131,997.

Bian et al., "Enlarged Waveguide for Photonic Intergrated Circuit Without Impacting Interconnect Layers", Flled Oct. 29, 2020 as U.S. Appl. No. 17/082,291.

* cited by examiner

PHOTONICS CHIPS INCLUDING A FULLY-DEPLETED SILICON-ON-INSULATOR FIELD-EFFECT TRANSISTOR

BACKGROUND

The present invention relates to photonics chips and, more specifically, to structures for a photonics chip that include a fully-depleted silicon-on-insulator field-effect transistor and methods of fabricating a structure for a photonics chip that includes a fully-depleted silicon-on-insulator field-effect transistor.

Photonics chips are used in many applications and systems including, but not limited to, data communication systems and data computation systems. A photonics chip integrates optical components, such as waveguides, photodetectors, modulators, and optical power splitters, and electronic components, such as field-effect transistors, into a unified platform. Among other factors, layout area, cost, and operational overhead may be reduced by the monolithic integration of both types of components on the same chip.

A photonics chip may be fabricated using a silicon-on-insulator substrate as a starting platform. The silicon-on-insulator substrate includes a device layer, a handle substrate, and a buried oxide layer that electrically isolates the device layer from the handle substrate. The performance of optical components may be limited because of restrictions imposed on the thickness of the device layer by the electronic components. For example, fully-depleted field-effect transistors are not found in a photonics chip due to the large device layer thickness. In addition, the ability to implement back-gate control for field-effect transistors is limited by the ability of the buried oxide layer to provide adequate electrical isolation.

Improved structures for a photonics chip that include a fully-depleted silicon-on-insulator field-effect transistor and methods of fabricating a structure for a photonics chip that includes a fully-depleted silicon-on-insulator field-effect transistor are needed.

SUMMARY

In an embodiment of the invention, a structure includes a substrate having a first device region and a second device region. The first device region of the substrate includes a first device layer having a top surface, a first portion of a second device layer, and a buried insulator layer separating the first device layer from the first portion of the second device layer. The second device region of the substrate includes a second portion of the second device layer. The first device layer has a thickness in a range of about 4 nanometers to about 20 nanometers. The first device layer in the first device region transitions in elevation to the second portion of the second device layer in the second device region with a step height equal to a sum of the thickness of the first device layer and a thickness of the buried insulator layer. The structure further includes a field-effect transistor in the first device region of the substrate and an optical component in the second device region of the substrate. The field-effect transistor includes a gate electrode on the top surface of the first device layer, and the optical component includes the second portion of the second device layer.

In an embodiment of the invention, a structure includes a substrate having a first device layer with a top surface, a second device layer, and a buried insulator layer separating the first device layer from the second device layer. The first device layer has a thickness in a range of about 4 nanometers to about 20 nanometers, and the buried insulator layer has a thickness in a range from about 5 nanometers to about 40 nanometers. A first field-effect transistor includes a first gate electrode on the top surface of a first portion of the first device layer, and a second field-effect transistor including a second gate electrode, a second portion of the first device layer, a first portion of the second device layer, and a gate dielectric provided by a section of the buried insulator layer. The section of the buried insulator layer is positioned between the second portion of the first device layer and the first portion of the second device layer.

In an embodiment, a method includes providing a substrate having a first device region and a second device region. The first device region of the substrate includes a first device layer having a top surface, a first portion of a second device layer, and a buried insulator layer separating the first device layer from the second device layer. The second device region of the substrate includes a second portion of the second device layer. The first device layer has a thickness in a range of about 4 nanometers to about 20 nanometers. The first device layer in the first device region transitions in elevation to the second portion of the second device layer in the second device region with a step height equal to a sum of the thickness of the first device layer and a thickness of the buried insulator layer. The method further comprises forming a field-effect transistor in the first device region of the substrate, and forming an optical component in the second device region of the substrate. The field-effect transistor includes a gate electrode on the top surface of the first device layer, and the optical component includes the second portion of the second device layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
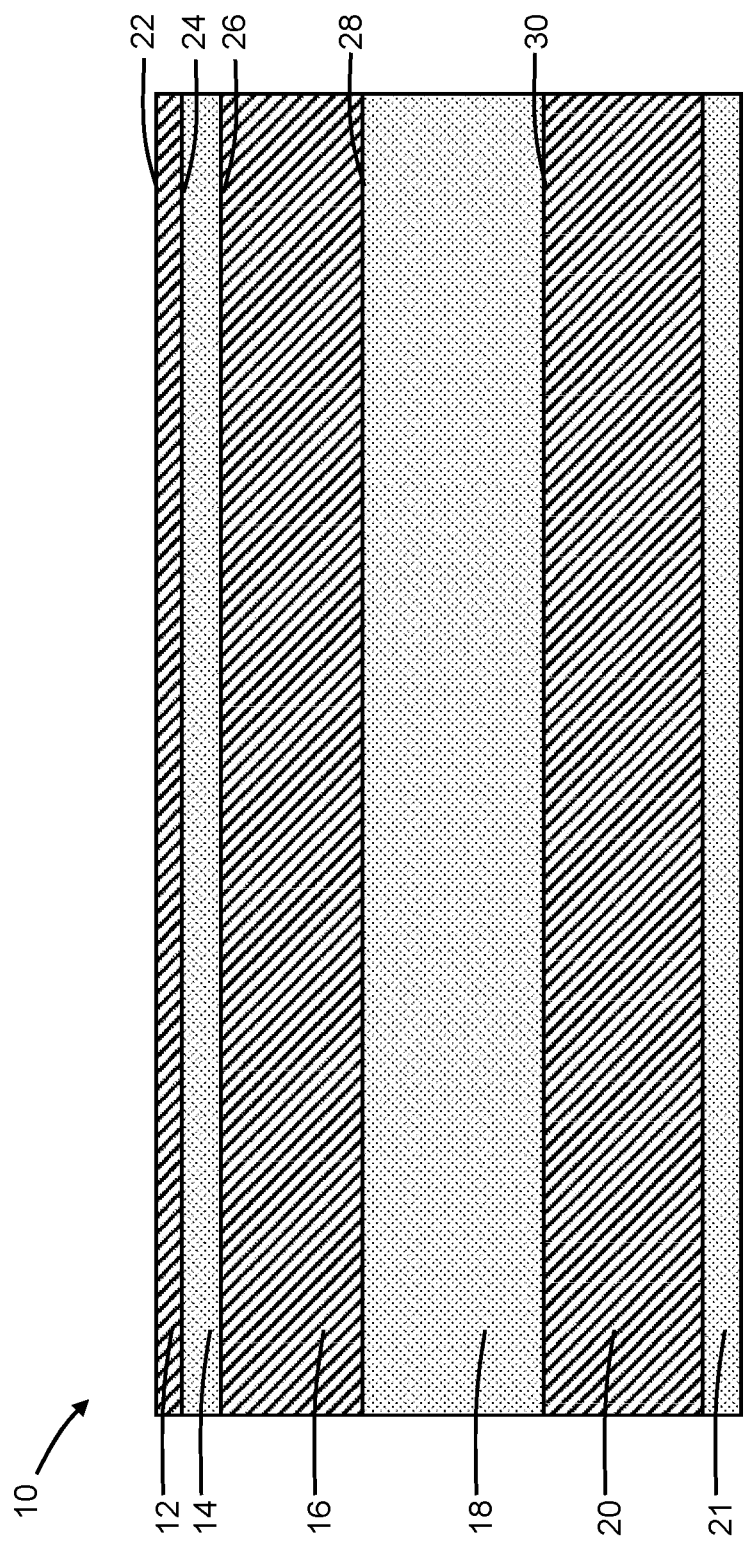
FIGS. 1-5 are cross-sectional views of a structure at successive fabrication stages of a processing method in accordance with embodiments of the invention.

With reference to FIG. 1 and in accordance with embodiments of the invention, a substrate 10 is provided for forming device structures for a monolithic photonics chip. In an embodiment, the substrate 10 may have a substrate stack that includes a device layer 12, a buried insulator layer 14, a device layer 16, a buried insulator layer 18, and a handle substrate 20. A dielectric layer 21 containing an electrical insulator, such as silicon dioxide, having a thickness equal to a few microns may be applied to the handle substrate 20 at the backside of the substrate stack. The device layer 12 is separated from the device layer 16 by the intervening buried insulator layer 14, and the device layer 16 is separated from the handle substrate 20 by the intervening buried insulator layer 18.

The device layer 12 has a top surface 22, and the device layer 12 shares a boundary with the buried insulator layer 14 along an interface 24 opposite to the top surface 22. The device layer 16 shares a boundary with the buried insulator layer 14 along an interface 26, and the device layer 16 shares a boundary with the buried insulator layer 18 along an interface 28 opposite to the interface 26. The handle substrate 20 shares a boundary with the buried insulator layer 18 along an interface 30.

The device layers 12, 16 and the handle substrate 20 may be comprised of a semiconductor material, such as single-crystal silicon. The device layer 16 is significantly thicker than the device layer 12. In an embodiment, the device layer 12 may have a thickness between the top surface 22 and interface 24 in a range of about 4 nanometers (nm) to about 20 nm, and the device layer 12 may be used to fabricate fully-depleted silicon-on-insulator (FDSOI) device structures as electronic components of the monolithic photonics chip. In an embodiment, the device layer 16 may have a thickness between the interfaces 26, 28 in a range of about 200 nm to about 350 nm. In an embodiment, the device layer 16 may be used to fabricate optical device structures as optical components of the monolithic photonics chip. In that regard, the thickness of the device layer 16 may be selected to minimize light propagation losses.

The buried insulator layers 14, 18 may be constituted by respective buried oxide (BOX) layers that are comprised of a layer of a solid dielectric material, such as silicon dioxide. The buried insulator layer 18 is significantly thicker than the buried insulator layer 14. The dielectric materials of the buried insulator layers 14, 18 have a refractive index that is less than the refractive index of the semiconductor materials of the device layers 12, 16. In an embodiment, the buried insulator layer 14 may have a thickness between the interfaces 24, 26 in a range of about 5 nm to about 40 nm, and the buried insulator layer 18 may have a thickness between the interfaces 28, 30 of about 1.5 microns to about 25 microns. In an embodiment, the thickness of the buried insulator layer 18 may be selected to minimize optical loss from an optical component formed using the device layer 16 to the handle substrate 20. The dielectric layer 21 may be utilized to protect the backside of the handle substrate 20, such as during the formation of a groove for the attachment of an optical fiber tip or a semiconductor laser to the photonics chip.

The formation of fully-depleted silicon-on-insulator device structures (e.g., FDSOI field-effect transistors), in which the depletion region in the device layer 12 expands fully to the buried insulator layer 14 under a typical gate voltage, is facilitated by the thickness (i.e., about 4 nm to about 20 nm) of the device layer 12. Conventional silicon-on-insulator substrates used to fabricate photonics chips have a device layer with a significantly larger thickness that is unsuitable for forming fully-depleted silicon-on-insulator device structures.

Figure 2:
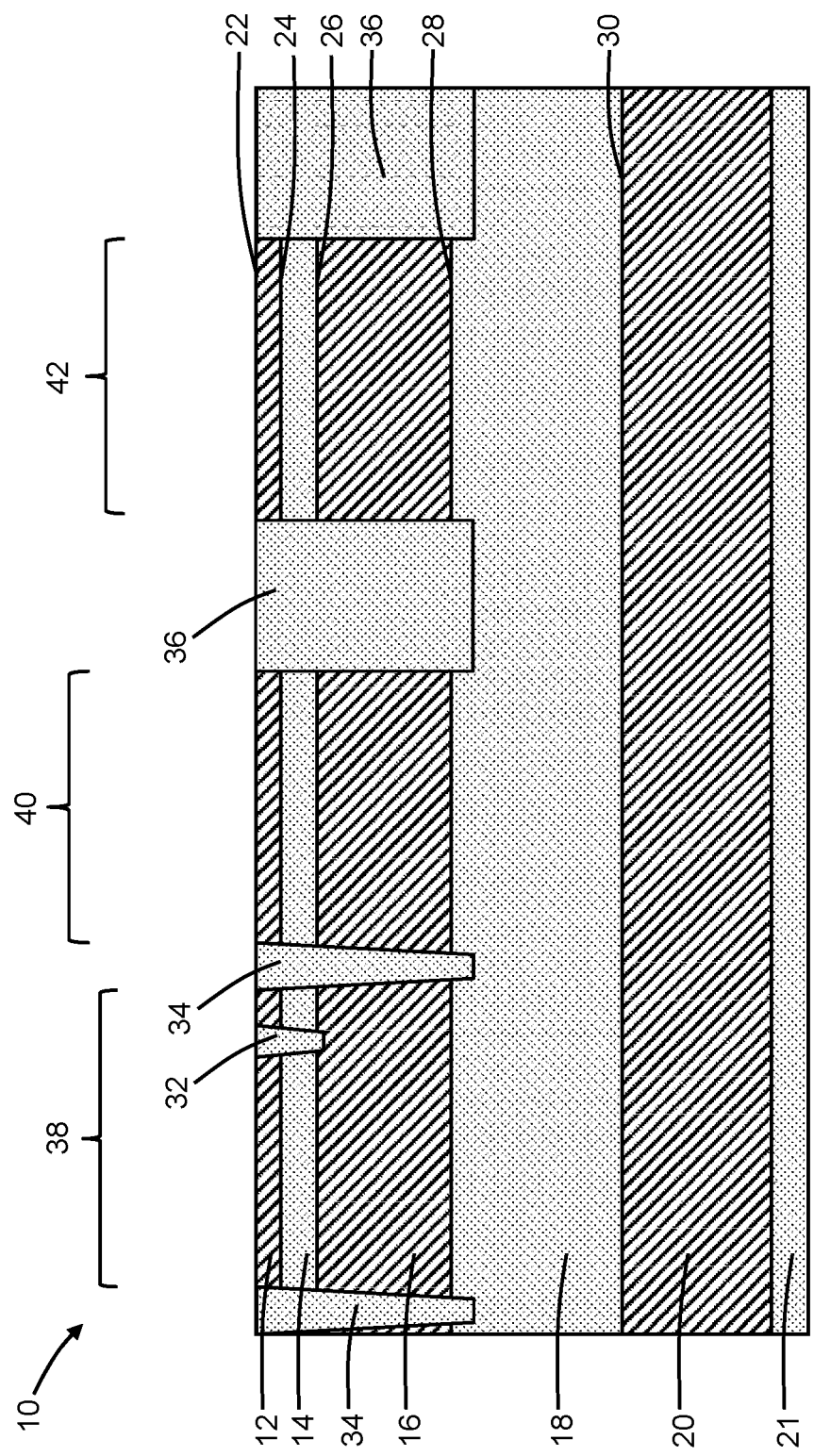

With reference to FIG. 2 in which like reference numerals refer to like features in FIG. 1 and at a subsequent fabrication stage, shallow trench isolation regions 32, 34, 36 are formed that extend from the top surface 22 of the device layer 12 into the substrate 10. The shallow trench isolation regions 32, 34, 36 may contain a dielectric material, such as silicon dioxide, that is deposited by chemical vapor deposition into trenches etched in the substrate 10 by a masked etching process, polished by chemical-mechanical planarization, and deglazed. The semiconductor materials of the device layers 12, 16 have a refractive index that is greater than the refractive index of the dielectric material of the shallow trench isolation regions 32, 34, 36.

The shallow trench isolation regions 36 may be wider than the shallow trench isolation region 32 or the shallow trench isolation regions 34. The shallow trench isolation regions 34, 36 surround and define device regions 38, 40, 42 in which different types of device structures may be formed, as subsequently described. The shallow trench isolation regions 34, 36 may be coextensive (i.e., share a boundary) with the device layers 12, 16 and the buried insulator layer 14 in the device regions 38, 40, 42. As such, each of the device regions 38, 40, 42 includes a portion of the device layer 12, a portion of the buried insulator layer 14, and a portion of the device layer 16.

In the representative embodiment, the shallow trench isolation region 32 may penetrate fully through the device layer 12 and the buried insulator layer 14, and the shallow trench isolation regions 34, 36 may penetrate fully through the device layer 12, the buried insulator layer 14, and the device layer 16. In an alternative embodiment, the shallow trench isolation regions 32, 34, 36 may all penetrate fully through the device layer 12, buried insulator layer 14, and device layer 16. In an alternative embodiment, the shallow trench isolation region 32 may penetrate fully through the device layer 12 and buried insulator layer 14, the shallow trench isolation regions 34 may penetrate fully through the device layer 12 and buried insulator layer 14 and only partially through the device layer 16, and the shallow trench isolation regions 36 may penetrate fully through the device layer 12, buried insulator layer 14, and device layer 16.

Figure 3:
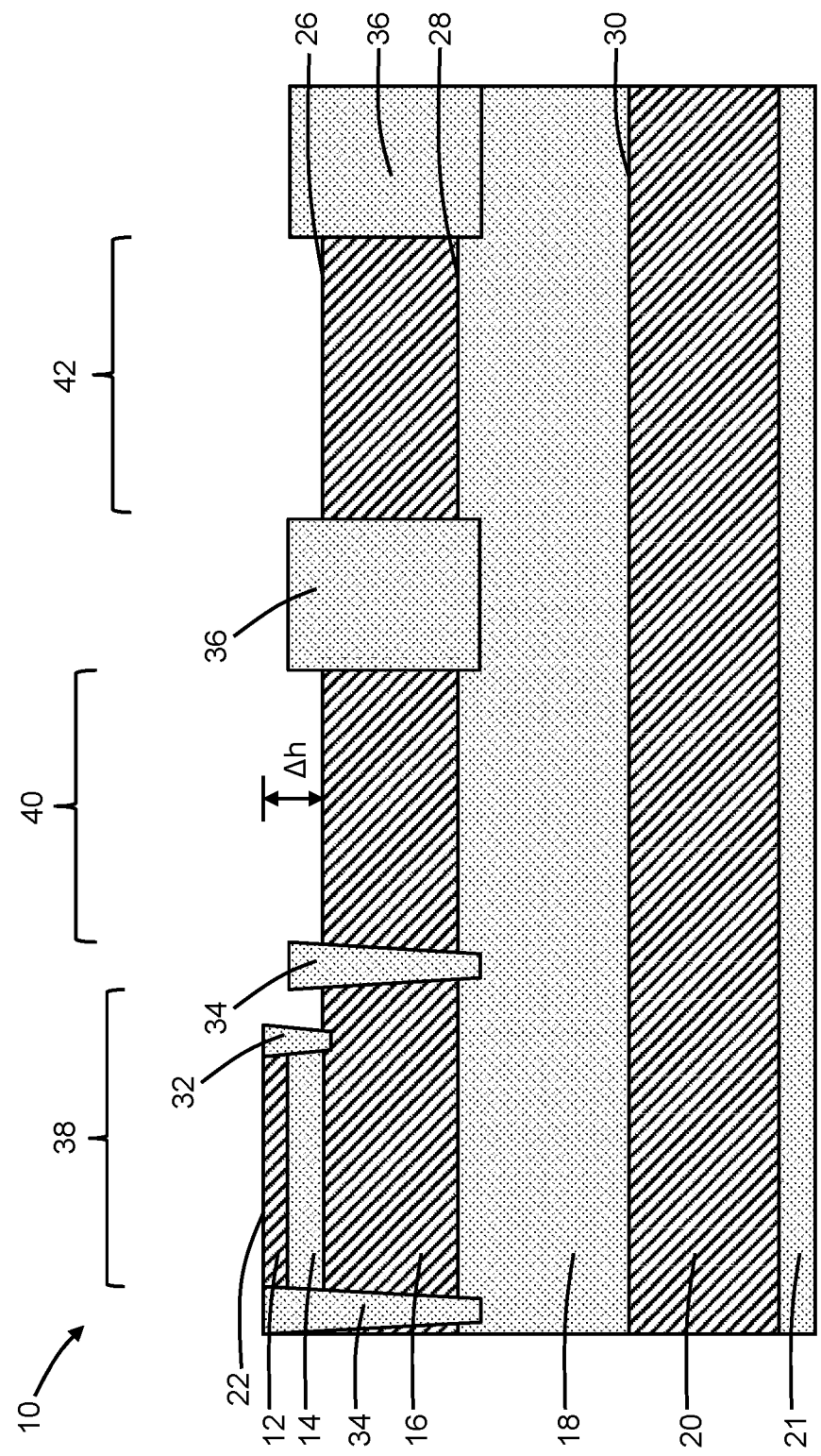

With reference to FIG. 3 in which like reference numerals refer to like features in FIG. 2 and at a subsequent fabrication stage, the portions of the device layer 12 and the sections of the buried insulator layer 14 are removed from the device region 40 and the device region 42. The portion of the device layer 12 and the portion of the buried insulator layer 14 are preserved and retained in the device region 38. In an embodiment, the device layer 12 and the buried insulator layer 14 are also removed from a part of the device region 38 to be subsequently used to establish a back-gate contact. In an alternative embodiment, the portions of the device layer 12 and the buried insulator layer 14 may remain fully intact in device region 38 if a back-gate contact is not needed. In the device regions 40, 42, the respective portion of the device layer 16 is exposed as the uppermost layer in the substrate stack.

The portions of the device layer 12 and the buried insulator layer 14 may be removed by patterning with lithography and etching processes. The lithography process may form an etch mask comprised of an organic photoresist that is applied by a spin coating process, pre-baked, exposed to light projected through a photomask, baked after exposure, and developed with a chemical developer to define an opening that encompasses the device regions 40, 42, as well as optionally the part of the device region 38 to be subsequently used to establish a back-gate contact. The etching process may be an anisotropic etching process, such as reactive ion etching, and the etch mask may be stripped following the etching process.

A step (i.e., a change in elevation) at the transition from the device region 38 to the device regions 40, 42 may be formed because of the removal of the device layer 12 and buried insulator layer 14 from the device regions 40, 42. More specifically, the step transitions in elevation from the portion of the device layer 12 in the device region 38 to the portions of the device layer 16 in the device regions 40, 42. The step may be characterized by a step height $\Delta h$ between the elevation of the device region 38 and the elevation of the device regions 40, 42. In an embodiment, the step height $\Delta h$ may be equal or substantially equal to the summed thickness of the device layer 12 and buried insulator layer 14. Unmasked shallow trench isolation regions 34, 36 may be shortened by the etching process removing the portions of the buried insulator layer 14.

The step height Δh between the device region 38 and the device regions 40, 42 is minimized by the small thicknesses of the device layer 12 and buried insulator layer 14. The thickness of the device layer 16 is selected independent of the thickness of the device layer 12, and the thickness of the device layer 16 may be selected to promote the performance of optical components formed in the device region 42 independent of the formation of a FDSOI device structure in device region 38. Conventional silicon-on-insulator substrates have a device layer and a buried insulator layer with respective thicknesses that, when removed, create a significantly larger step height, which results in limitations on the thickness of the device layer and consequently restrictions imposed on the performance of optical components.

Figure 4:
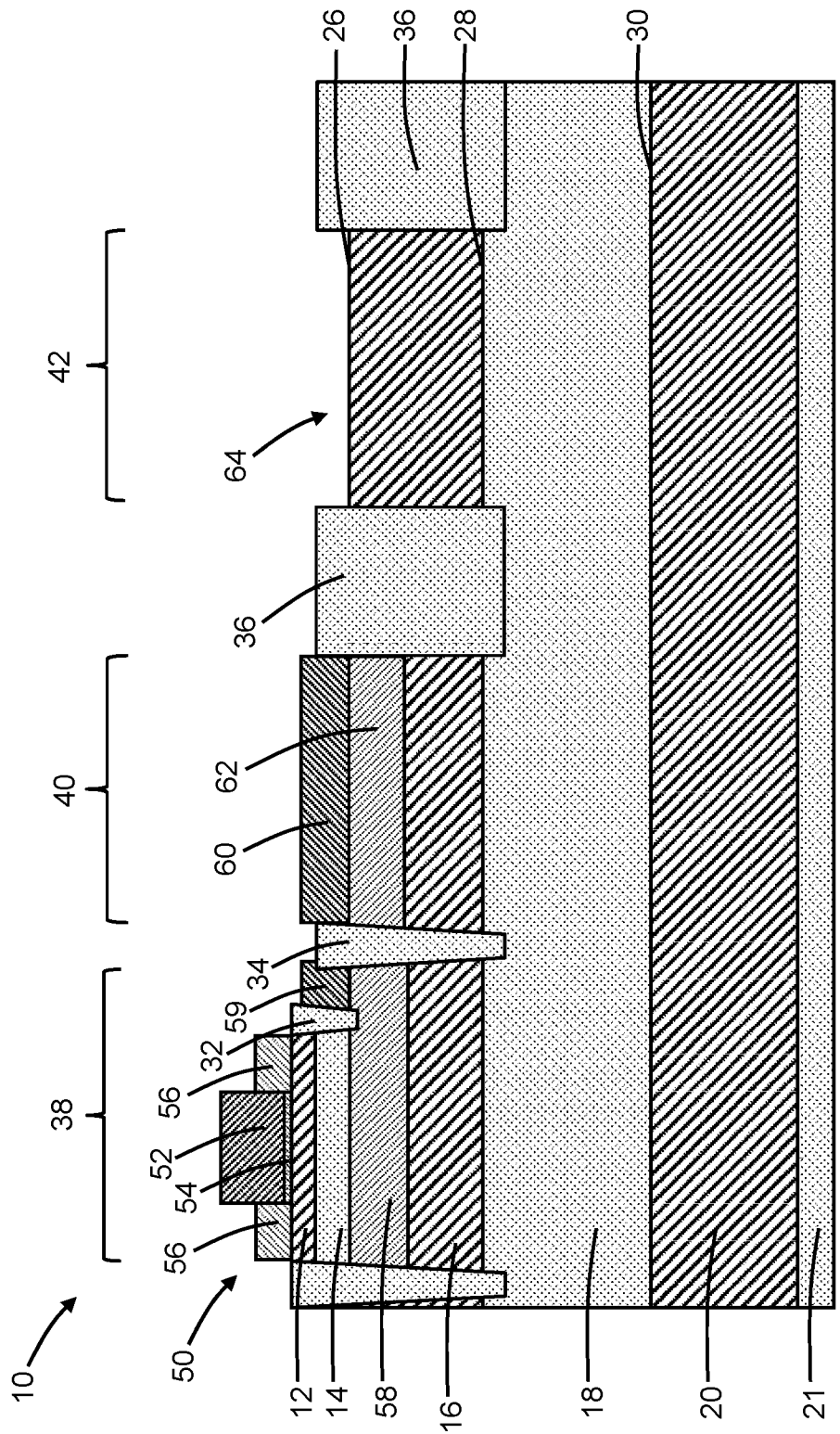

With reference to FIG. 4 in which like reference numerals refer to like features in FIG. 3 and at a subsequent fabrication stage, a field-effect transistor 50 may be formed by complementary-metal oxide-semiconductor (CMOS) processes as an electronic component in the device region 38. The field-effect transistor 50 may include a gate electrode 52 comprised of a conductor, such as doped polycrystalline silicon (i.e., doped polysilicon) or a work function metal, and a gate dielectric 54 comprised of an electrical insulator, such as silicon dioxide, hafnium oxide, or another dielectric material. The gate electrode 52 and gate dielectric 54 may be formed by depositing a layer stack and patterning the layer stack with photolithography and etching processes. The gate electrode 52 is positioned on the top surface of the portion of the device layer 12 in the device region 38.

The field-effect transistor 50 may further include source/drain regions 56 and a semiconductor body provided by the portion of the device layer 12 in the device region 38. In an embodiment, the field-effect transistor 50 may be an n-type field-effect transistor. In that instance, the source/drain regions 56 may contain semiconductor material doped with an n-type dopant (e.g., arsenic, antimony, and/or phosphorus) to provide n-type electrical conductivity, and the substrate 10 and the device layer 12 may contain semiconductor material doped with a p-type dopant (e.g., boron or indium) to provide p-type electrical conductivity. The polarity of the dopant types may be swapped such that the field-effect transistor 50 is a p-type field-effect transistor, instead of an n-type field-effect transistor, and the section of the device layer 12 providing the semiconductor body may be modified to be composed of crystalline silicon-germanium (cSiGe) instead of silicon.

The field-effect transistor 50 presents a FDSOI device structure having a depletion region in a channel defined in the semiconductor body that expands in a vertical direction fully through the portion of the device layer 12 to the buried insulator layer 14 under a typical gate voltage applied to the gate electrode 52. Full depletion during operation is made possible because of the small thickness of the device layer 12.

The portion of the device layer 16 in the device region 38 may be doped, before forming the field-effect transistor 50, to provide a well 58 that is doped either n-type or p-type. In an embodiment, the well 58 may be doped by ion implantation. The well 58 may function to permit back-gate biasing of the field-effect transistor 50. A well tap 59 may be formed on the device layer 16 and used to contact the well 58. The well 58 is separated from the handle substrate 20 by a relative-thick buried dielectric layer, in comparison with conventional silicon-on-insulator substrates, that may allow for the application of higher back-gate bias voltages.

A passive device 60 may be formed as an electronic component in the device region 40. The passive device 60 may be, for example, a diode. The device layer 16 may be doped to provide a well 62 that is either n-type or p-type.

The portion of the device layer 16 in the device region 42 may provide, or participate in providing, an optical component. In an embodiment, the optical component may be a waveguide core 64 that is used to guide light on the photonics chip. The dielectric materials of the buried insulator layer 18 and the shallow trench isolation regions 36 may supply low-refractive index cladding for the waveguide core 64 of higher refractive index. The optical component (i.e., the waveguide core 64) can be co-integrated with the FDSOI device structure of the field-effect transistor 50 without sacrificing performance to minimize the step height between the device region 38 and the device regions 40, 42. As a result, the larger thickness of the section of the device layer 16 used to construct the waveguide core 64 may be selected independent of the smaller thickness of the device layer 12 in order to optimize the performance of the waveguide core 64.

Figure 5:
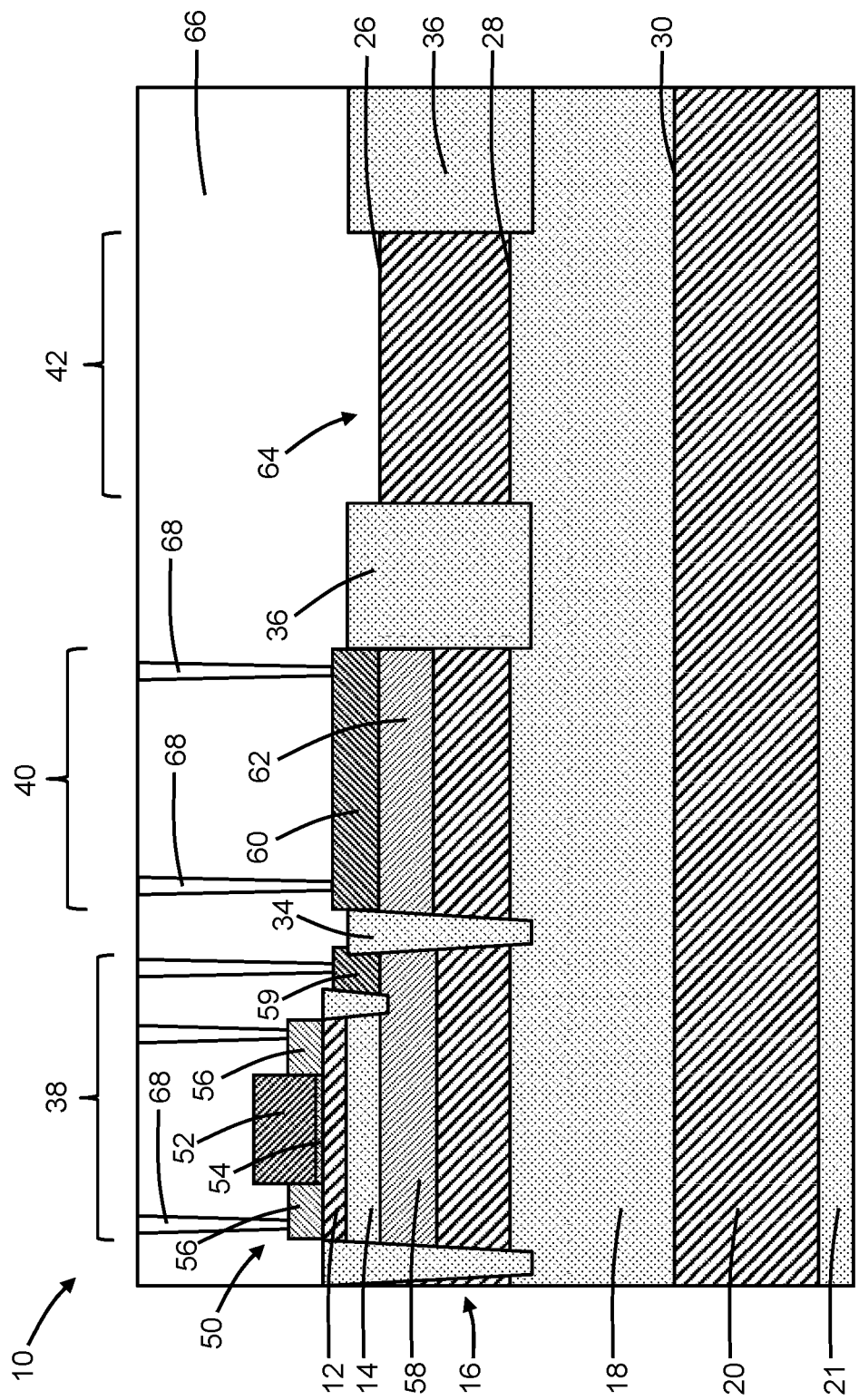

With reference to FIG. 5 in which like reference numerals refer to like features in FIG. 4 and at a subsequent fabrication stage, middle-of-line processing and back-end-of-line processing follow the formation of optical electronic components. In that regard, a dielectric layer 66 may be deposited and planarized, and contacts 68 may be formed in the dielectric layer 66. In an embodiment, the dielectric layer 66 may be comprised of silicon dioxide, and the contacts 68 may be comprised of tungsten. In an embodiment, a stress liner may be formed over the field-effect transistor 50 prior to depositing the dielectric layer 66.

Figure 6:
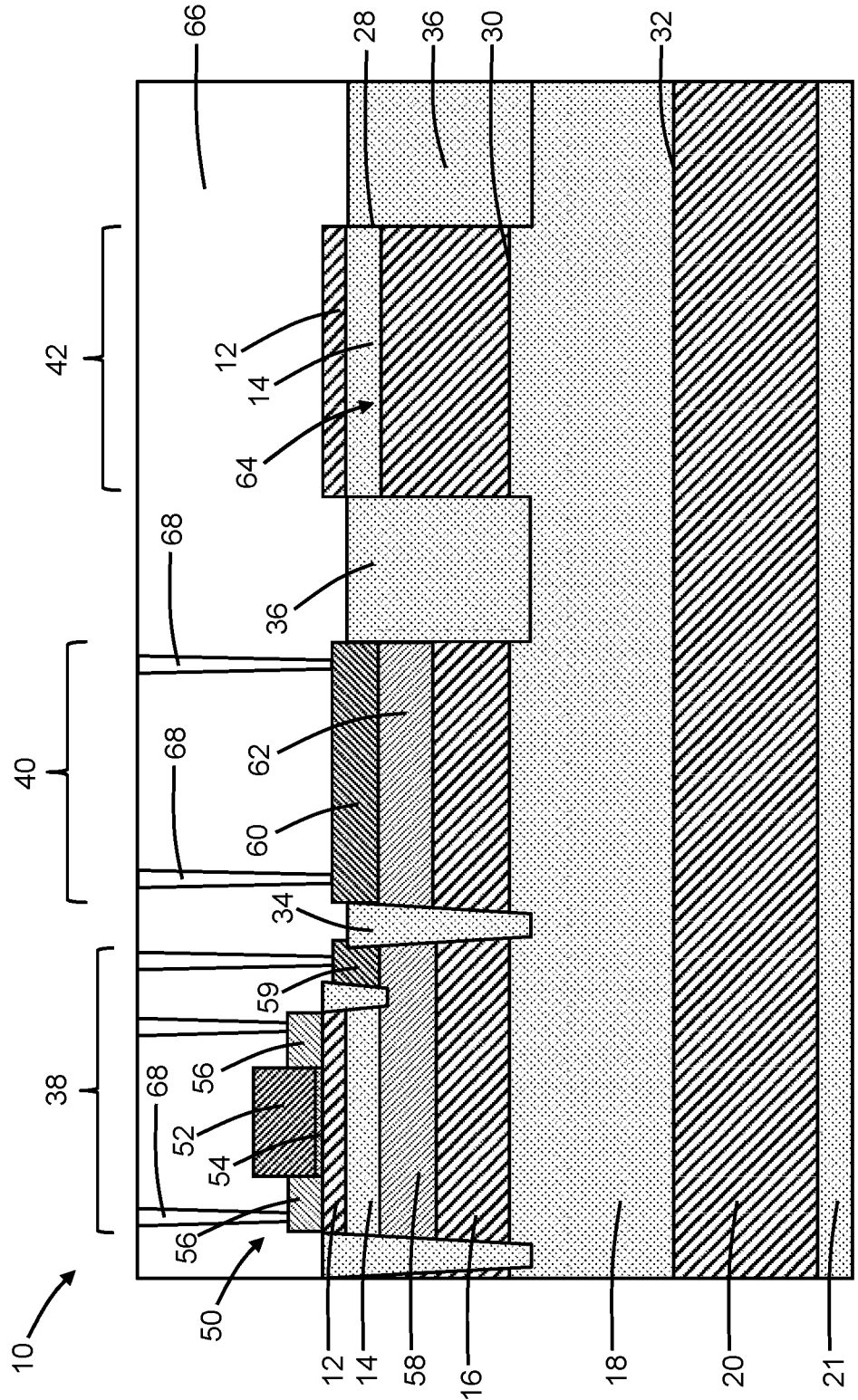
FIGS. 6-13 are cross-sectional views of structures in accordance with alternative embodiments of the invention.

With reference to FIG. 6 in which like reference numerals refer to like features in FIG. 5 and in accordance with alternative embodiments, the portion of the device layer 12 and the portion of the buried insulator layer 14 may be retained as top cladding over the waveguide core 64, which may enhance mode confinement in the waveguide core 64. The etch mask may be adjusted to cover and protect the portion of the device layer 12 and the portion of the buried insulator layer 14 in the device region 42 during the etching process, which preserves the device layer 12 and the buried insulator layer 14 in the device region 42 over the waveguide core 64. With the adjusted etch mask, the portion of the device layer 12 and the portion of the buried insulator layer 14 are still removed from device region 40, and the portion of the device layer 12 and the portion of the buried insulator layer 14 are still preserved in device region 38.

Figure 7:
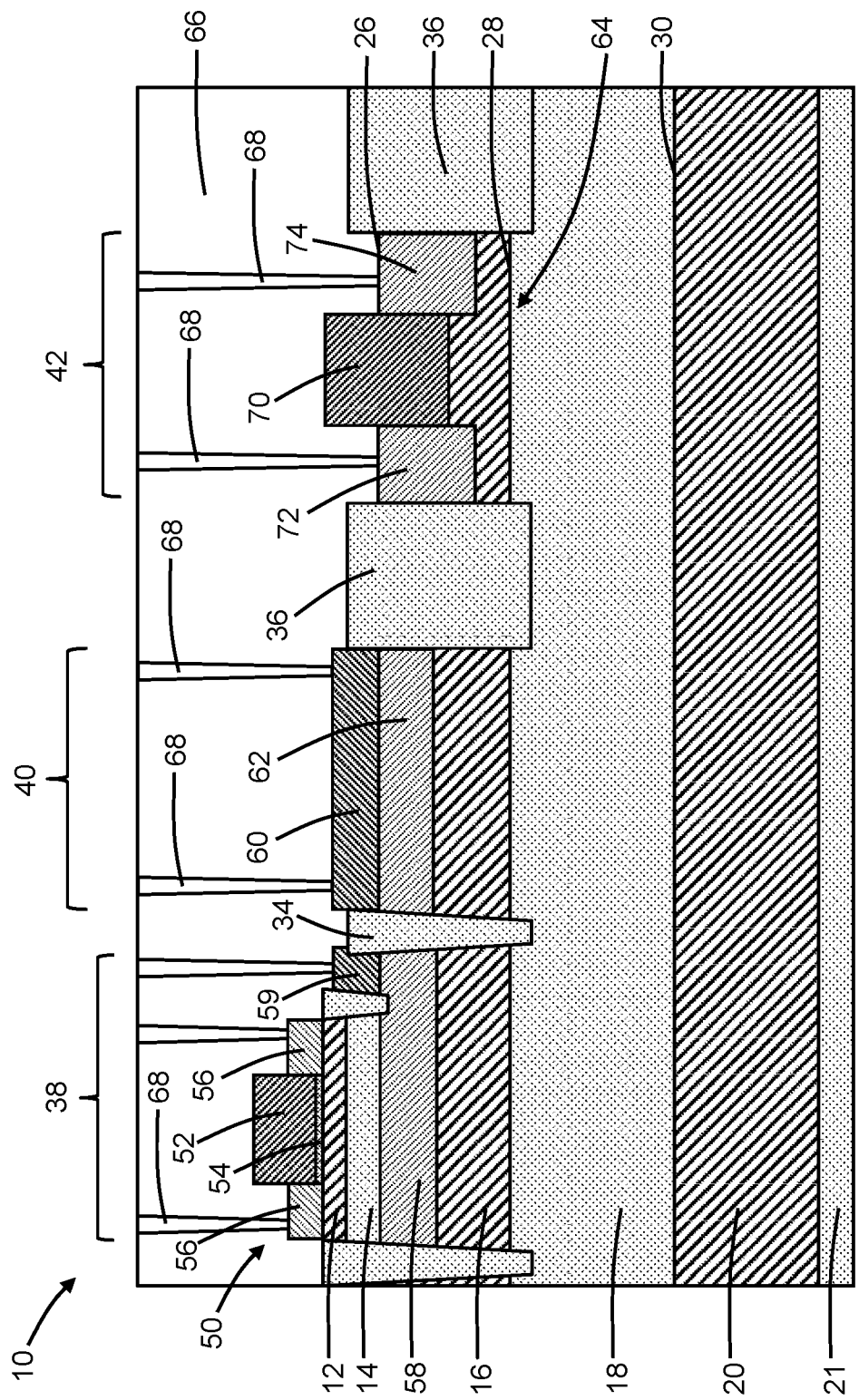

With reference to FIG. 7 in which like reference numerals refer to like features in FIG. 5 and in accordance with alternative embodiments, a photodiode may be formed as an optical component in the device region 42. To that end, a light-absorbing layer 70 may be formed in a trench patterned by lithography and etching processes in the portion of the device layer 16 in device region 42. The light-absorbing layer 70 may be comprised of a material that is capable of converting light to charge carriers and that is different in composition from the device layer 16. In an embodiment, the light-absorbing layer 70 may comprise a material having a composition that includes germanium. In an embodiment, the light-absorbing layer 70 may comprise a material having a composition that exclusively includes germanium. In an embodiment, the light-absorbing layer 70 may define a light-absorbing region of the photodetector that further includes an anode 72 and a cathode 74 formed as doped regions of opposite conductivity type in the portion of the device layer 16. Contacts 68 may be coupled to the anode 72 and cathode 74 in order to collect charge carriers generated by the light-absorbing layer 70. Light, such as laser light, may be guided on the photonics chip to the photodiode by a waveguide core defined by other portions of the device layer 16 in the device region 42.

Figure 8:
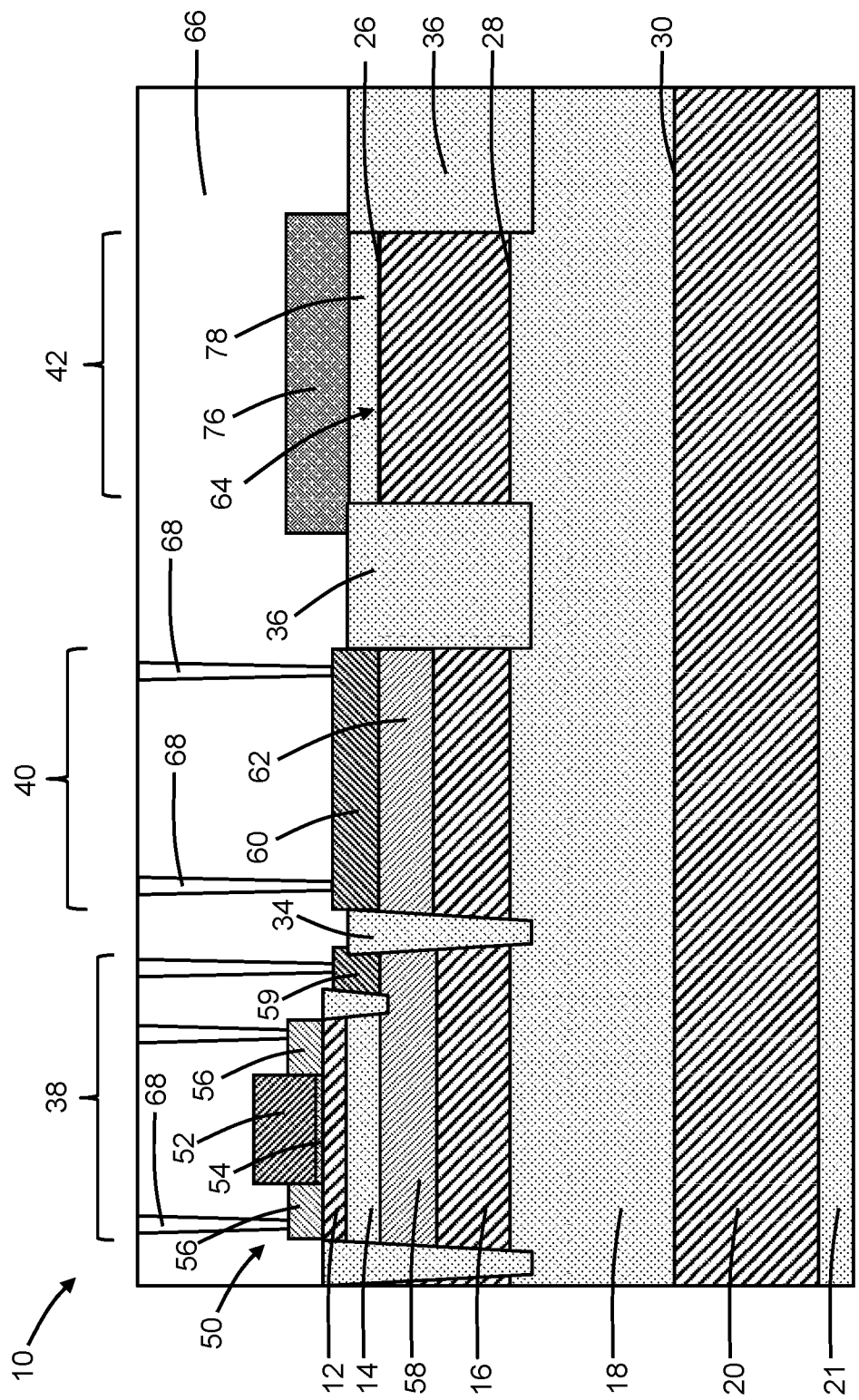

With reference to FIG. 8 in which like reference numerals refer to like features in FIG. 5 and in accordance with alternative embodiments, a waveguide core 76 may be formed over the waveguide core 64. The waveguide core 76 may have a different composition than the waveguide core 64 and may be separated from the waveguide core 64 by a dielectric layer 78. In an embodiment, the waveguide core 76 may be comprised of silicon nitride, and the dielectric layer 78 may be comprised of silicon dioxide. The stacked combination of the waveguide core 64 and the waveguide core 76 may be included in an optical coupler configured for vertical light transfer, a polarization splitter and rotator, or a different type of optical component.

Figure 9:
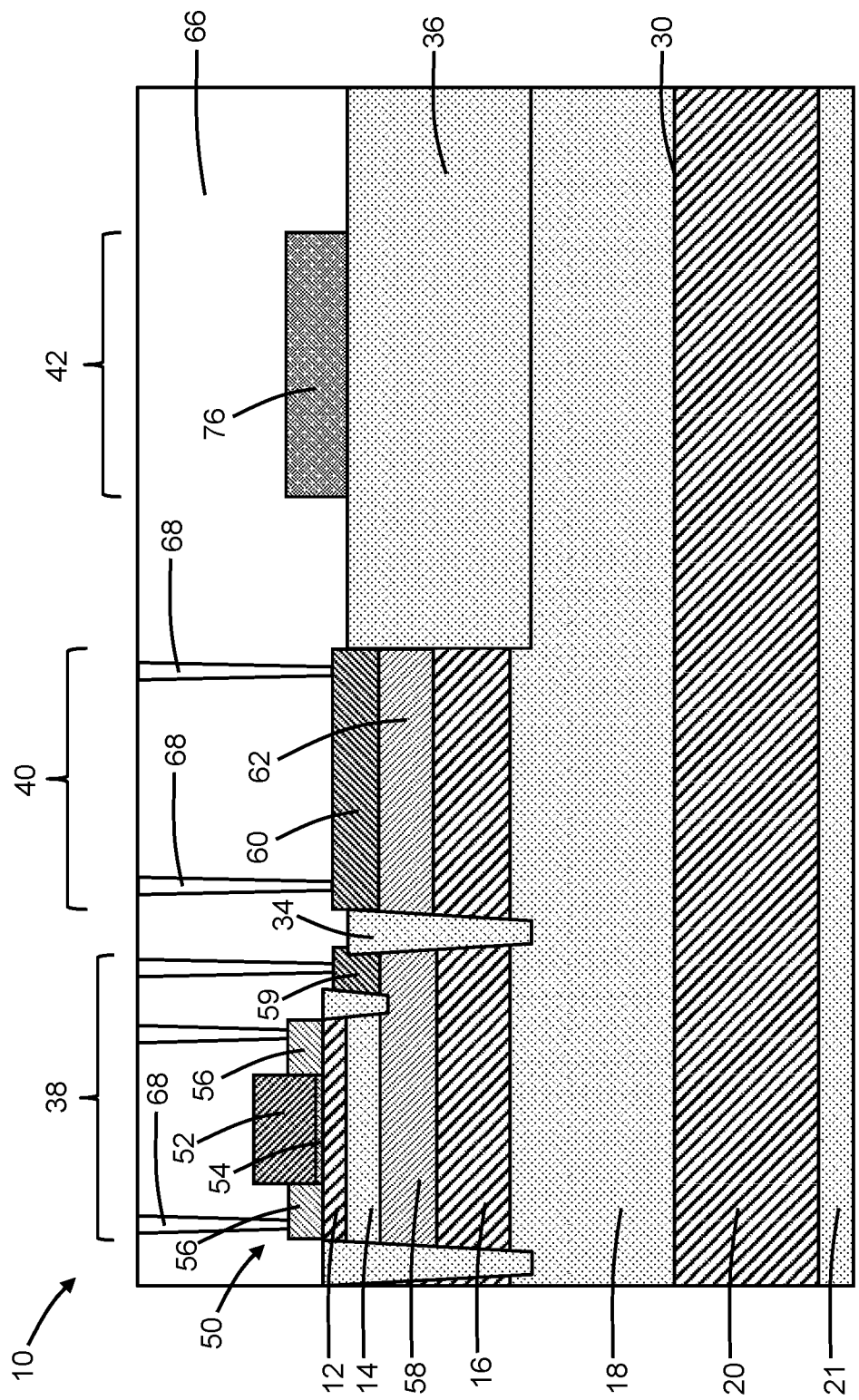

With reference to FIG. 9 in which like reference numerals refer to like features in FIG. 8 and in accordance with alternative embodiments, the device layer 16 may be fully removed from device region 42 and replaced by an enlarged shallow trench isolation region 36 that constitutes a continuous layer of dielectric material. The waveguide core 76 may be formed over the enlarged shallow trench isolation region 36.

Figure 10:
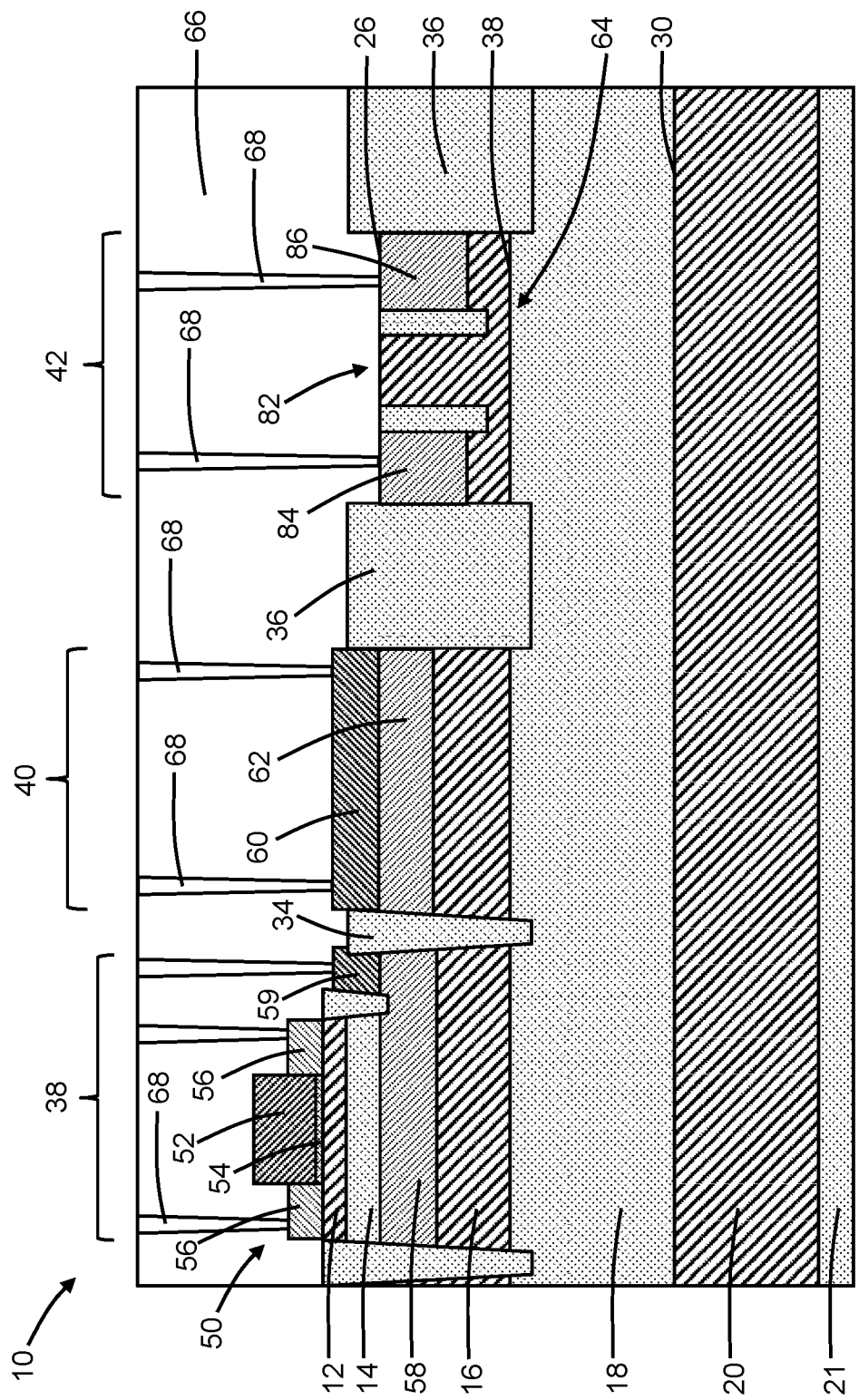

With reference to FIG. 10 in which like reference numerals refer to like features in FIG. 5 and in accordance with alternative embodiments, the portion of the device layer 16 in the device region 42 may be modified to form an electro-optic modulator that includes a rib waveguide core 82 that includes a thin slab layer, and an anode 84 and a cathode 86 as doped regions of opposite conductivity type in the portion of the device layer 16. The electro-optic modulator can be used as an optical switch to modulate the amplitude or phase of laser light under the control of an electrical signal for converting continuous laser light into an encoded data stream containing binary data. In that regard, contacts 68 may be coupled to the anode 84 and cathode 86 in order to supply the electrical signal used to control the operation of the electro-optic modulator. Light, such as laser light, may be guided on the photonics chip to the electro-optic modulator by a waveguide core defined by other portions of the device layer 16 in the device region 42.

In an alternative embodiment, the anode 84 and cathode 86 may be omitted from the rib waveguide core 82. The rib waveguide core 82 may be utilized to guide light, such as laser light, on the photonics chip.

Figure 11:
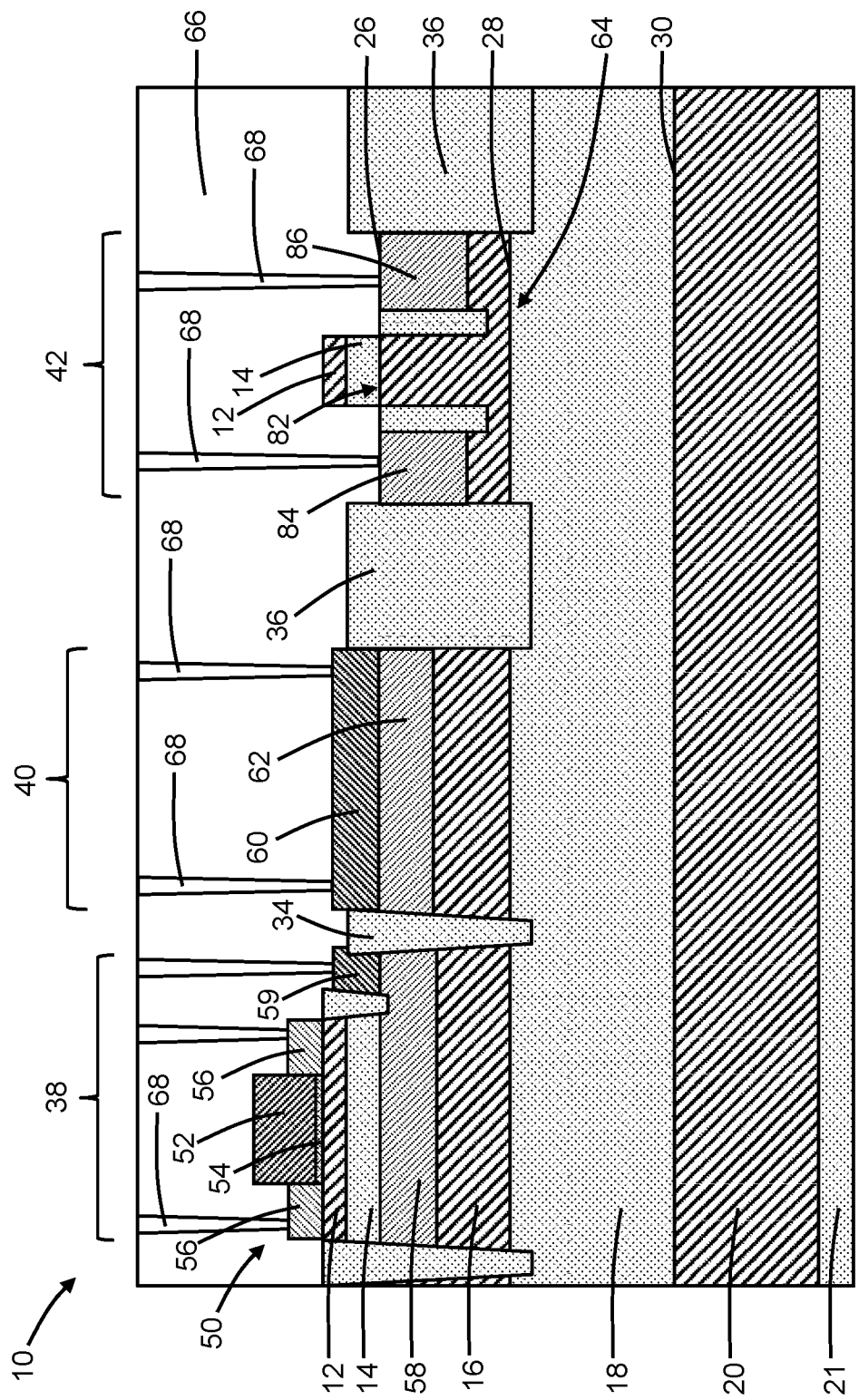

With reference to FIG. 11 in which like reference numerals refer to like features in FIG. 10 and in accordance with alternative embodiments, the portion of the device layer 12 and the portion of the buried insulator layer 14 may be retained as top cladding over the rib waveguide core 82, which may enhance mode confinement in the rib waveguide core 82. The etch mask may be adjusted to cover and protect the portions of the device layer 12 and buried insulator layer 14 in the device region 42 during the etching process, which preserves the portions of the device layer 12 and buried insulator layer 14 in the device region 42 over the rib waveguide core 82. With the adjusted etch mask, the portion of the device layer 12 and the portion of the buried insulator layer 14 are still removed from device region 40, and the portion of the device layer 12 and the portion of the buried insulator layer 14 are still preserved in device region 38.

Figure 12:
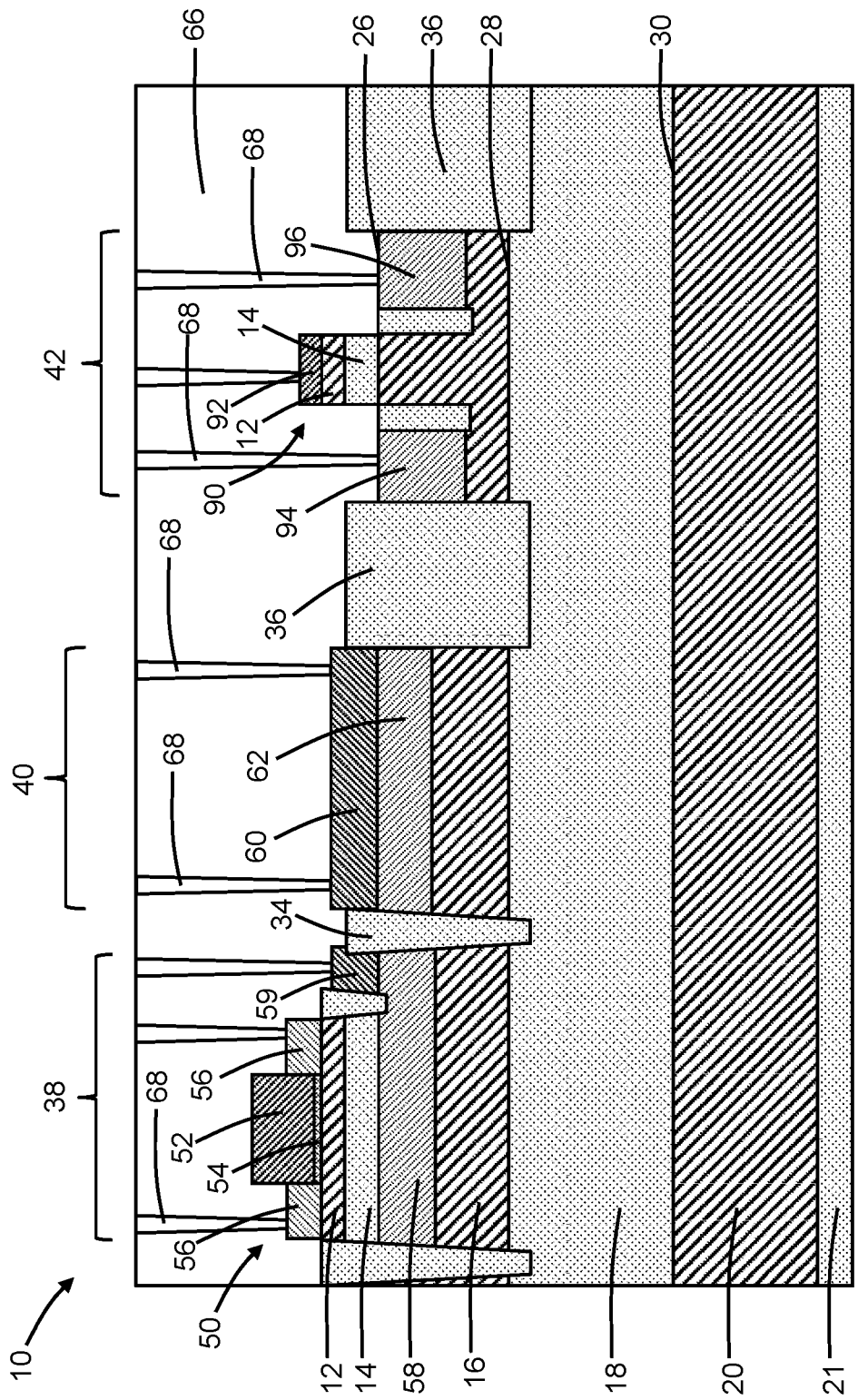

With reference to FIG. 12 in which like reference numerals refer to like features in FIG. 5 and in accordance with alternative embodiments, a field-effect transistor 90 configured to handle high voltages may be formed using the device layer 16 in the device region 42. The portion of the device layer 12 and the portion of the buried insulator layer 14 may be retained in the device region 42, and a gate 92 may be formed over the device layer 12. The portion of the buried insulator layer 14 beneath the gate 92 operates as a high-voltage gate dielectric. A raised source 94 and a raised drain 96 may be formed on the portion of the device layer 16 in the device region 42. The field-effect transistor 90 may be formed without consideration of substrate biasing and wells are not needed.

Figure 13:
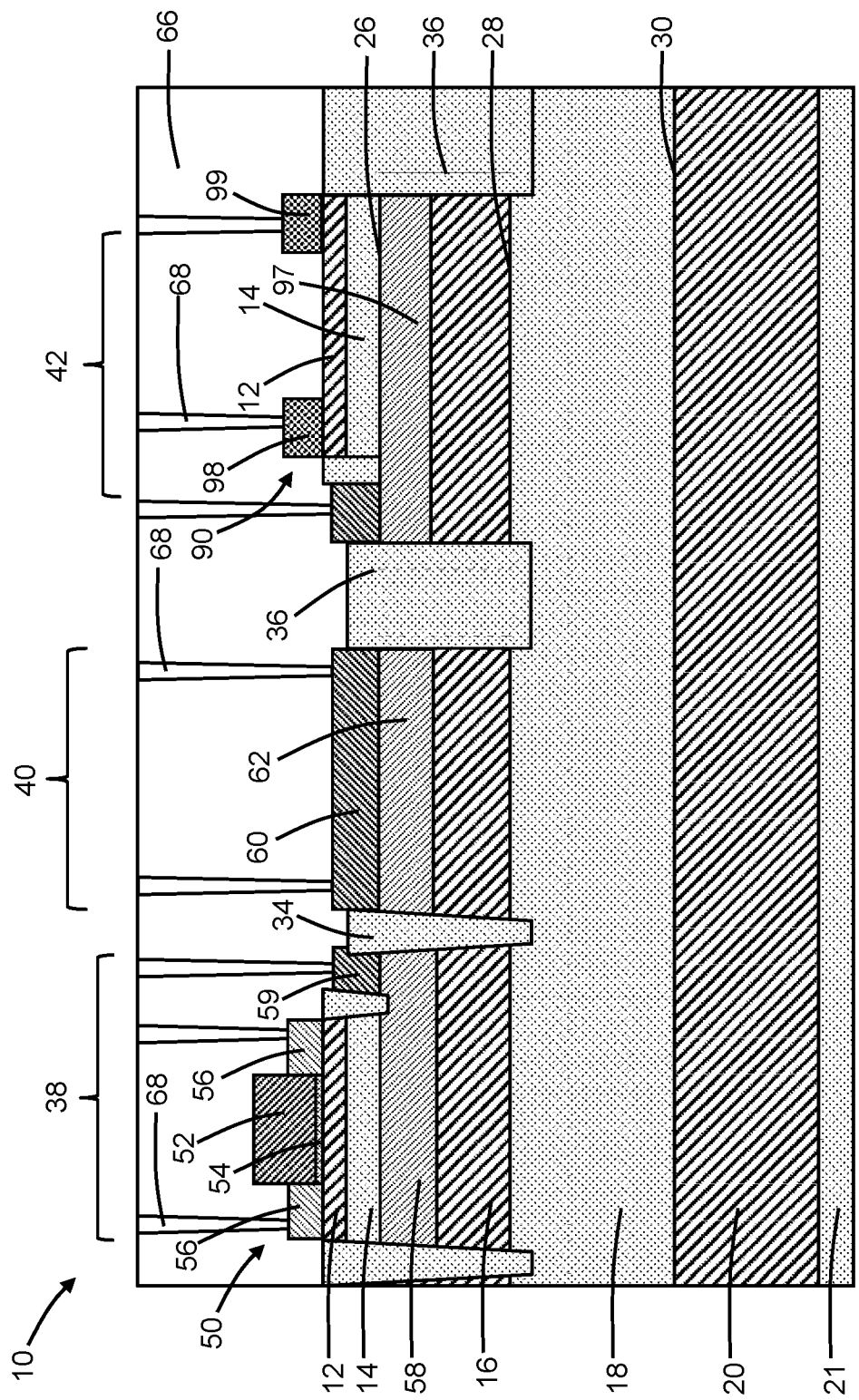

With reference to FIG. 13 in which like reference numerals refer to like features in FIG. 12 and in accordance with alternative embodiments, the high-voltage field-effect transistor 90 may have a different configuration. The portions of the device layer 12 and the buried insulator layer 14 may be retained in the device region 42, and a gate 97 may be formed as a doped region in the portion of the device layer 16 in the device region 42. The portion of the buried insulator layer 14 over the gate 92 operates as a high-voltage gate dielectric. A source 98 and a drain 99 may be formed on the portion of the device layer 12. In an embodiment, the gate 97 may be concurrently formed with the well 58.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may overlap if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a substrate including a first device layer having a top surface, a second device layer, and a first buried insulator layer separating the first device layer from the second device layer;
    a first field-effect transistor including a first gate electrode on the top surface of a first portion of the first device layer and a first gate dielectric, the first gate dielectric between the top surface and the first gate electrode; and
    a second field-effect transistor including a second gate electrode, a second portion of the first device layer, a first portion of the second device layer, and a second gate dielectric provided by a section of the first buried insulator layer, and the section of the first buried insulator layer is positioned between the second portion of the first device layer and the first portion of the second device layer;
    wherein the first device layer has a thickness in a range of about 4 nanometers to about 20 nanometers, and the second portion of the first device layer transitions in elevation to the first portion of the second device layer with a step height equal to a sum of the thickness of the first device layer and the thickness of the first buried insulator layer.

2. The structure of claim 1 wherein the second device layer has a thickness in a range from about 200 nanometers to about 350 nanometers.

3. The structure of claim 1 wherein the first buried insulator layer has a thickness in a range from about 5 nanometers to about 40 nanometers.

4. The structure of claim 1 wherein the first buried insulator layer has a thickness in a range from about 5 nanometers to about 40 nanometers.

5. The structure of claim 1 further comprising:
    a shallow trench isolation region comprising a dielectric material in a trench surrounding the second field-effect transistor.

6. The structure of claim 5 wherein the substrate further includes a handle substrate and a second buried insulator layer separating the second device layer from the handle substrate.

7. The structure of claim 6 wherein the shallow trench isolation region penetrates fully through the second buried insulator layer.

8. The structure of claim 1 wherein the substrate further includes a handle substrate and a second buried insulator layer separating the second device layer from the handle substrate.

9. The structure of claim 8 wherein the second buried insulator layer is thicker than the first buried insulator layer.

10. The structure of claim 8 wherein the second buried insulator layer has a thickness in a range of about 1.5 microns to about 25 microns.

11. The structure of claim 10 wherein the first buried insulator layer has a thickness in a range from about 5 nanometers to about 40 nanometers.

12. The structure of claim 10 wherein the first device layer has a thickness in a range of about 4 nanometers to about 20 nanometers.

13. The structure of claim 1 wherein the second field-effect transistor includes a raised source and a raised drain on the first portion of the second device layer.

14. The structure of claim 1 further comprising:
    a passive device on a second portion of the second device layer.

15. The structure of claim 1 wherein the first device layer and the second device layer comprise single-crystal silicon, and the first buried insulator layer comprises silicon dioxide.

16. The structure of claim 1 wherein the second device layer is thicker than the first device layer.

* * * * *